(12) United States Patent
Shkalim et al.

(10) Patent No.: US 12,400,314 B2
(45) Date of Patent: Aug. 26, 2025

(54) MASK INSPECTION FOR SEMICONDUCTOR SPECIMEN FABRICATION

(71) Applicant: Applied Materials Israel Ltd., Rehovot (IL)

(72) Inventors: Ariel Shkalim, DN Sede-Gat (IL); Evgeny Bal, Natanya (IL)

(73) Assignee: Applied Materials Israel Ltd., Rehovot (IL)

( * ) Notice: Subject to any disclaimer, the term of this patent is extended or adjusted under 35 U.S.C. 154(b) by 392 days.

(21) Appl. No.: 17/473,342

(22) Filed: Sep. 13, 2021

(65) Prior Publication Data

US 2023/0080151 A1    Mar. 16, 2023

(51) Int. Cl.
*G06T 7/00* (2017.01)
*G01N 21/956* (2006.01)
(Continued)

(52) U.S. Cl.
CPC ..... *G06T 7/0008* (2013.01); *G01N 21/95607* (2013.01); *G03F 7/7065* (2013.01);
(Continued)

(58) Field of Classification Search
CPC ........... G06T 2207/30148; G06T 7/001; G06T 7/0006; H01L 22/12; G01N 21/9501;
(Continued)

(56) References Cited

U.S. PATENT DOCUMENTS

2004/0057611 A1\*   3/2004   Lee ................. G03F 7/7065
                                                382/145
2004/0179726 A1\*   9/2004   Burdorf ........... G01N 21/95607
                                                382/144
(Continued)

OTHER PUBLICATIONS

Verechagin et al., "Automated mask and wafer defect classification using a novel method for generalized CD variation measurements," Proc. SPIE 10585, Metrology, Inspection, and Process Control for Microlithography XXXII, 1058531 (Mar. 13, 2018); https://doi.org/10.1117/12.2302714 (Year: 2018).\*

(Continued)

*Primary Examiner* — Emily C Terrell
*Assistant Examiner* — Julia Z. Yao
(74) *Attorney, Agent, or Firm* — Lowenstein Sandler LLP

(57) ABSTRACT

There is provided a system and method of a method of mask inspection, comprising: obtaining a first image representative of at least part of the mask; applying a printing threshold on the first image to obtain a second image; estimating a contour for each structural element of interest (SEI) of a group of SEIs, and extracting a set of attributes characterizing the contour, giving rise to a group of contours corresponding to the group of SEIs and respective sets of attributes associated therewith; for each given contour, identifying, among the remaining contours in the group of contours, one or more reference contours similar to the given contour, by comparing between the respective sets of attributes associated therewith; and measuring a deviation between the given contour and each reference contour (Continued)

thereof, giving rise to one or more measured deviations indicative of whether a defect is present.

20 Claims, 10 Drawing Sheets

(51) Int. Cl.
  *G03F 7/00* (2006.01)
  *G06T 7/11* (2017.01)
(52) U.S. Cl.
  CPC ...... *G06T 7/11* (2017.01); *G01N 2021/95615* (2013.01); *G01N 2021/95676* (2013.01); *G06T 2207/30148* (2013.01)
(58) Field of Classification Search
  CPC ....... G01N 21/956; G01N 2021/95676; G01N 21/95607; G01N 2021/95615; G01N 21/9515; G03F 1/84; G03F 7/70625; G03F 1/36; G01B 11/24; G01B 11/2433; G06V 10/772
  See application file for complete search history.

(56) References Cited

U.S. PATENT DOCUMENTS

| | | | | |
|---|---|---|---|---|
| 2012/0155740 A1* | 6/2012 | Cho | ........................ | G06T 7/001 382/149 |
| 2013/0336573 A1* | 12/2013 | Dalla-Torre | ............ | G06T 7/001 382/145 |
| 2015/0078650 A1* | 3/2015 | Sezginer | .............. | G01N 21/958 382/141 |
| 2015/0324664 A1* | 11/2015 | Zhao | ........................ | G06T 7/001 382/144 |
| 2016/0370300 A1* | 12/2016 | Ogawa | ...................... | G03F 1/84 |
| 2019/0154593 A1* | 5/2019 | Urano | ................ | G01N 21/9501 |
| 2022/0137514 A1* | 5/2022 | Wang | .................. | G03F 7/70625 355/53 |
| 2023/0005157 A1* | 1/2023 | Okamoto | .............. | G06T 7/0004 |

OTHER PUBLICATIONS

Shkalim et al., "193nm mask inspection challenges and approaches for 7nm/5nm technology and beyond," Proc. SPIE 11148, Photomask Technology 2019, 111481G (Sep. 26, 2019); https://doi.org/10.1117/12.2537511 (Year: 2019).*

Baykal, "Machine Vision Algorithms for Line-Scan TDI Cameras," Feb. 2005, University of Calgary, Dept. of Electrical and Computer Engineering, Thesis for the Degree of Doctor of Philosophy (Year: 2005).*

Jozefov et al., "Die-To-Database Inspection—An Effective Method Of Detecting And Locating Defects On Reticles," Proc. SPIE 0633, Optical Microlithography V, (Aug. 20, 1986); https://doi.org/10.1117/12.963712 (Year: 1986).*

* cited by examiner

MASK INSPECTION FOR SEMICONDUCTOR SPECIMEN FABRICATION

TECHNICAL FIELD

The presently disclosed subject matter relates, in general, to the field of mask inspection, and more specifically, to defect detection with respect to a photomask.

BACKGROUND

Current demands for high density and performance associated with ultra large-scale integration of fabricated microelectronic devices require submicron features, increased transistor and circuit speeds, and improved reliability. As semiconductor processes progress, pattern dimensions such as line width, and other types of critical dimensions, are continuously shrunken. Such demands require formation of device features with high precision and uniformity, which, in turn, necessitates careful monitoring of the fabrication process, including automated examination of the devices while they are still in the form of semiconductor wafers.

Semiconductor devices are often manufactured using photo lithographic masks (also referred to as photomasks or masks or reticles) in a photolithography process. The photolithography process is one of the principal processes in the manufacture of semiconductor devices, and comprises patterning a wafer's surface in accordance with the circuit design of the semiconductor devices to be produced. Such a circuit design is first patterned on a mask. Hence, in order to obtain operating semiconductor devices, the mask must be defect free. Masks are manufactured by a complex process and can suffer from various defects and variations.

In addition, the mask is often used in a repeated manner to create many dies on the wafer. Thus, any defect on the mask will be repeated multiple times on the wafer and will cause multiple devices to be defective. Establishing a production-worthy process requires tight control of the overall lithography process. Within this process, critical dimension (CD) control is a determining factor with respect to device performance and yield.

Various mask inspection methods have been developed and are available commercially. According to certain conventional techniques of designing and evaluating masks, the mask is created and used to expose therethrough a wafer, and then an inspection is performed to determine whether the features/patterns of the mask have been transferred to the wafer according to the design. Any variations in the final printed features from the intended design may necessitate modifying the design, repairing the mask, creating a new mask, and/or exposing a new wafer.

In this regard, the verification of the accuracy and quality of the printed features permits an indirect method of verifying the mask. However, since the final printed pattern on the wafer or die is formed after the printing process, e.g., the resist development, the substrate treatment (such as material etching or deposition), etc, it may be difficult to attribute, discriminate or isolate errors in the final printed pattern to problems associated with the mask and/or the resist deposition and/or the developing processes. Moreover, inspecting the final printed pattern on the wafer or die tends to offer a limited number of samples usable to detect, determine, and resolve any processing issues. This process may also be labor intensive and presents an extensive inspection and analysis time.

Alternatively, a mask can be directly inspected using various mask inspection tools.

SUMMARY

In accordance with certain aspects of the presently disclosed subject matter, there is provided a computerized system of inspecting a mask usable for fabricating a semiconductor specimen, the system comprising a processing and memory circuitry (PMC) configured to: obtain a first image representative of at least part of the mask, wherein the first image is acquired by emulating optical configuration of a lithographic tool usable for fabrication of the semiconductor specimen; apply a printing threshold on the first image, giving rise to a second image, wherein the second image is informative of a plurality of structural elements of the mask which are printable on the semiconductor specimen; estimate a contour for each structural element of interest (SEI) of a group of SEIs from the plurality of structural elements, and extract a set of attributes characterizing the contour, giving rise to a group of contours corresponding to the group of SEIs and respective sets of attributes associated therewith; for each given contour of the group of contours, identify, among the remaining contours in the group of contours, one or more reference contours similar to the given contour, by comparing between the respective sets of attributes associated therewith; and measure a deviation between the given contour and each of the one or more reference contours thereof, giving rise to one or more measured deviations indicative of whether a defect is present with respect to the SEI associated with the given contour.

In addition to the above features, the system according to this aspect of the presently disclosed subject matter can comprise one or more of features (i) to (xiii) listed below, in any desired combination or permutation which is technically possible:

(i). The mask comprises a mask field of a single die and a scribe region, and the at least part of the mask includes at least part of the single die and/or at least part of the scribe region.

(ii). The mask comprises a mask field of a plurality of dies and a scribe region, and the at least part of the mask includes at least part of the scribe region.

(iii). The first image is acquired by an actinic inspection tool configured to emulate the optical configuration of the lithographic tool.

(iv). The first image is obtained by acquiring an image using a non-actinic inspection tool, and performing simulation on the image to simulate the optical configuration of the lithographic tool, giving rise to the first image.

(v). The defect is an edge displacement indicative of a relatively substantial deviation of the given contour from an expected position thereof (vi). The contour is estimated using an edge detection method.

(vii). The set of attributes is selected from a group comprising area formed by the contour, width of the area, height of the area, the number of pixels along the contour, chain code, and center of gravity.

(viii). The PMC is configured to measure a deviation by registering the given contour respectively with the one or more reference contours, giving rise to one or more registered pairs of contours; measuring distances between corresponding points of each registered pair of contours; and selecting a maximal distance from the measured distances as the measured deviation between the given contour and a respective reference contour of the one or more reference contours.

(ix). The PMC is further configured to derive a combined deviation based on the one or more measured deviations, apply a deviation threshold to the combined deviation, and report presence of a defect upon the combined deviation crossing the deviation threshold.

(x). The PMC is further configured to provide a defect map corresponding to the first image and indicative of presence of defects on the at least part of the mask, and locations thereof (xi). The PMC is configured to obtain a plurality of first images each representative of a respective part of the mask, the plurality of first images being acquired consecutively with a predefined step size, such that a plurality of fields of view (FOVs) of the plurality of first images are not overlapped.

The PMC is configured to perform the applying, estimating, identifying and measuring for each of the plurality of first images independently, and provide a defect map corresponding to each of the plurality of first images and indicative of presence of defects on the respective part of the mask, thereby giving rise to a plurality of defect maps corresponding to the plurality of first images.

(xii). The PMC is further configured to identify one or more SEIs associated with a defect presented in each of the plurality of defect maps, compare one or more contours of the one or more SEIs between the plurality of first images, and determine whether at least one defect is a false alarm indicative of the presence of a unique structural element in at least one of the first images.

(xiii). The PMC is configured to obtain, for a given part of the mask, a plurality of first images each representative of at least the given part, the plurality of first images being acquired in a consecutive manner with a predefined step size, such that a plurality of fields of view (FOVs) of the plurality of first images are overlapped by at least the given part.

The PMC is configured to perform the applying, estimating, identifying and measuring for each of the plurality of first images, provide a defect map corresponding to each of the plurality of first images and indicative of the presence of defects on the at least given part, thereby giving rise to a plurality of defect maps corresponding to the plurality of first images, and compare defects presented in the plurality of defect maps to determine whether a defect is a defect of interest or a false alarm.

In accordance with other aspects of the presently disclosed subject matter, there is provided a method of inspecting a mask usable for fabricating a semiconductor specimen, the method performed by a processing and memory circuitry (PMC) and comprising: obtaining a first image representative of at least part of the mask, wherein the first image is acquired by emulating optical configuration of a lithographic tool usable for fabrication of the semiconductor specimen; applying a printing threshold on the first image, giving rise to a second image, wherein the second image is informative of a plurality of structural elements of the mask which are printable on the semiconductor specimen; estimating a contour for each structural element of interest (SEI) of a group of SEIs from the plurality of structural elements, and extracting a set of attributes characterizing the contour, giving rise to a group of contours corresponding to the group of SEIs and respective sets of attributes associated therewith; for each given contour of the group of contours, identifying, among the remaining contours in the group of contours, one or more reference contours similar to the given contour, by comparing between the respective sets of attributes associated therewith; and measuring a deviation between the given contour and each of the one or more reference contours thereof, giving rise to one or more measured deviations indicative of whether a defect is present with respect to the SEI associated with the given contour.

This aspect of the disclosed subject matter can comprise one or more of features (i) to (xiii) listed above with respect to the system, mutatis mutandis, in any desired combination or permutation which is technically possible.

In accordance with other aspects of the presently disclosed subject matter, there is provided a non-transitory computer readable medium comprising instructions that, when executed by a computer, cause the computer to perform a method of inspecting a mask usable for fabricating a semiconductor specimen, the method comprising: obtaining a first image representative of at least part of the mask, wherein the first image is acquired by emulating optical configuration of a lithographic tool usable for fabrication of the semiconductor specimen; applying a printing threshold on the first image, giving rise to a second image, wherein the second image is informative of a plurality of structural elements of the mask which are printable on the semiconductor specimen; estimating a contour for each structural element of interest (SEI) of a group of SEIs from the plurality of structural elements, and extracting a set of attributes characterizing the contour, giving rise to a group of contours corresponding to the group of SEIs and respective sets of attributes associated therewith; for each given contour of the group of contours, identifying, among the remaining contours in the group of contours, one or more reference contours similar to the given contour, by comparing between the respective sets of attributes associated therewith; and measuring a deviation between the given contour and each of the one or more reference contours thereof, giving rise to one or more measured deviations indicative of whether a defect is present with respect to the SEI associated with the given contour.

This aspect of the disclosed subject matter can comprise one or more of features (i) to (xiii) listed above with respect to the system, mutatis mutandis, in any desired combination or permutation which is technically possible.

BRIEF DESCRIPTION OF THE DRAWINGS

In order to understand the disclosure and to see how it may be carried out in practice, embodiments will now be described, by way of non-limiting example only, with reference to the accompanying drawings, in which.

DETAILED DESCRIPTION OF EMBODIMENTS

Figure 1:
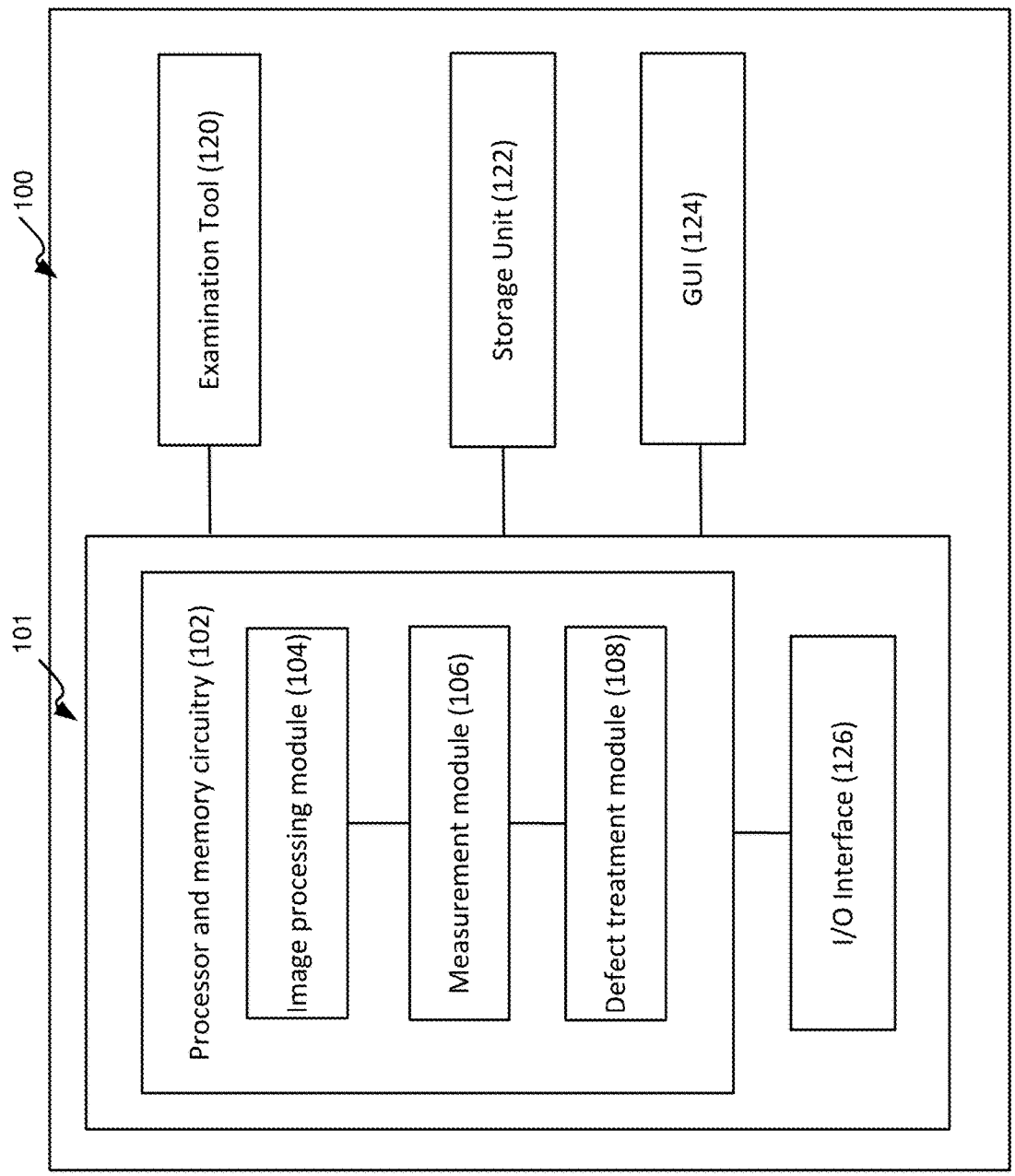
FIG. 1 illustrates a functional block diagram of a mask inspection system in accordance with certain embodiments of the presently disclosed subject matter.

In the following detailed description, numerous specific details are set forth in order to provide a thorough understanding of the disclosure. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "inspecting", "obtaining", "emulating", "applying", "estimating", "extracting", "identifying", "comparing", "measuring", "acquiring", "performing", "registering", "selecting", "deriving", "reporting", "providing", "determine", or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the mask inspection system, the mask defect detection system, and respective parts thereof disclosed in the present application.

The term "mask" used in this specification is also referred to as "photolithographic mask", or "photomask", or "reticle". Such terms should be construed equivalently and expansively to cover a template holding circuit design (e.g., defining the layout of a specific layer of an integrated circuit) to be patterned on a semiconductor wafer in a photolithography process. By way of example, a mask can be implemented as a fused silica plate covered with a pattern of opaque, transparent and phase-shifting areas which are projected onto wafers in the lithography process. By way of example, a mask can be an Extreme Ultraviolet (EUV) mask or an Argon Fluoride (ArF) mask. By way of another example, a mask can be a memory mask (usable for fabricating a memory device) or a logic mask (usable for fabricating a logic device).

The term "inspection" or "mask inspection" used in this specification should be expansively construed to cover any operation for assessing the accuracy and integrity of a fabricated photomask with respect to the circuit design and its ability to produce an accurate representation of the circuit design onto the wafer. The inspection can include any kind of operations related to defect detection, defect review and/or defect classification of various types, and/or metrology operations during and/or after the mask fabrication process and/or during the usage of the mask for semiconductor specimen fabrication. Inspection can be provided by using non-destructive inspection tools after fabrication of the mask. By way of non-limiting example, the inspection process can include one or more of the following operations: scanning (in a single or in multiple scans), imaging, sampling, detecting, measuring, classifying and/or other operations provided with regard to the mask or parts thereof, using an inspection tool. Likewise, mask inspection can also be construed to include, for example, generating an inspection recipe(s) and/or other setup operations, prior to the actual inspection of the mask. It is noted that, unless specifically stated otherwise, the term "inspection" or its derivatives used in this specification are not limited with respect to resolution or size of an inspection area. A variety of non-destructive inspection tools includes, by way of non-limiting example, optical inspection tools, scanning electron microscopes, atomic force microscopes, etc.

The term "metrology operation" used in this specification should be expansively construed to cover any metrology operation procedure used to extract metrology information relating to one or more structural elements on a mask. In some embodiments, the metrology operations can include measurement operations, such as, e.g., critical dimension (CD) measurements performed with respect to certain structural elements on the specimen, including but not limiting to the following: dimensions (e.g., line widths, line spacing, contact diameters, size of the element, edge roughness, gray level statistics, etc.), shapes of elements, distances within or between elements, related angles, overlay information associated with elements corresponding to different design levels, etc. Measurement results such as measured images are analyzed for example, by employing image-processing techniques. Note that, unless specifically stated otherwise, the term "metrology" or derivatives thereof used in this specification are not limited with respect to measurement technology, measurement resolution or size of inspection area.

The term "specimen" used in this specification should be expansively construed to cover any kind of wafers, related structures, combinations and/or parts thereof used for manufacturing semiconductor integrated circuits, magnetic heads, flat panel displays, and other semiconductor-fabricated articles.

The term "defect" used in this specification should be expansively construed to cover any kind of abnormality or undesirable feature formed on a mask. A defect in some cases can refer to a real defect or a defect of interest (DOI)

which, when printed on the wafer, has certain effects on the functionality of the fabricated device. In some other cases, a defect can refer to a nuisance or "false alarm" defect which is a suspected defect that can be ignored because it has no effect on the functionality of the completed device.

The terms "non-transitory memory" and "non-transitory storage medium" used herein should be expansively construed to cover any volatile or non-volatile computer memory suitable to the presently disclosed subject matter. The terms should be taken to include a single medium or multiple media (e.g., a centralized or distributed database, and/or associated caches and servers) that store the one or more sets of instructions. The terms shall also be taken to include any medium that is capable of storing or encoding a set of instructions for execution by the computer and that cause the computer to perform any one or more of the methodologies of the present disclosure. The terms shall accordingly be taken to include, but not be limited to, a read only memory ("ROM"), random access memory ("RAM"), magnetic disk storage media, optical storage media, flash memory devices, etc.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Bearing this in mind, attention is drawn to FIG. 1 illustrating a functional block diagram of a mask inspection system in accordance with certain embodiments of the presently disclosed subject matter.

The inspection system 100 illustrated in FIG. 1 can be used for inspection of a mask during or after the mask fabrication process. As described above, the inspection referred to herein can be construed to cover any kind of operations related to defect detection, and/or defect classification of various types, and/or metrology operations, such as, e.g., critical dimension (CD) measurements, with respect to the mask or parts thereof. According to certain embodiments of the presently disclosed subject matter, the illustrated inspection system 100 comprises a computer-based system 101 capable of automatically detecting defects with respect to structural elements on the mask. Specifically, in some embodiments, the defects to be detected in the present disclosure relate to edge displacement of the structural elements on the mask. System 101 is thus also referred to as a mask defect detection system, which is a sub-system of the inspection system 100.

System 101 can be operatively connected to a mask inspection tool 120 which is configured to scan a mask and capture one or more images thereof for inspection of the mask. The term "mask inspection tool" used herein should be expansively construed to cover any type of inspection tools that can be used in mask inspection related processes, including, by way of non-limiting example, scanning (in a single or in multiple scans), imaging, sampling, detecting, measuring, classifying and/or other processes provided with regard to the mask or parts thereof.

Without limiting the scope of the disclosure in any way, it should also be noted that the mask inspection tool 120 can be implemented as inspection machines of various types, such as optical inspection tools, electron beam tools, and so on. In some cases, the mask inspection tool 120 can be a relatively low-resolution inspection tool (e.g., an optical inspection tool, a low-resolution Scanning Electron Microscope (SEM), etc.). In some cases, the mask inspection tool 120 can be a relatively high-resolution inspection tool (e.g., a high-resolution SEM, an Atomic Force Microscopy (AFM), a Transmission Electron Microscope (TEM), etc.). In some cases, the inspection tool can provide both low-resolution image data and high-resolution image data. In some embodiments, the mask inspection tool 120 has metrology capabilities and can be configured to perform metrology operations on the captured images. The resulting image data (low-resolution image data and/or high-resolution image data) can be transmitted—directly or via one or more intermediate systems—to system 101.

According to certain embodiments, the mask inspection tool can be implemented as an actinic inspection tool configured to emulate/mimic optical configurations of a lithographic tool (such as, e.g., a scanner or a stepper) usable for fabrication of a semiconductor specimen, e.g., by projecting a pattern formed in a mask onto a wafer.

Figure 5:
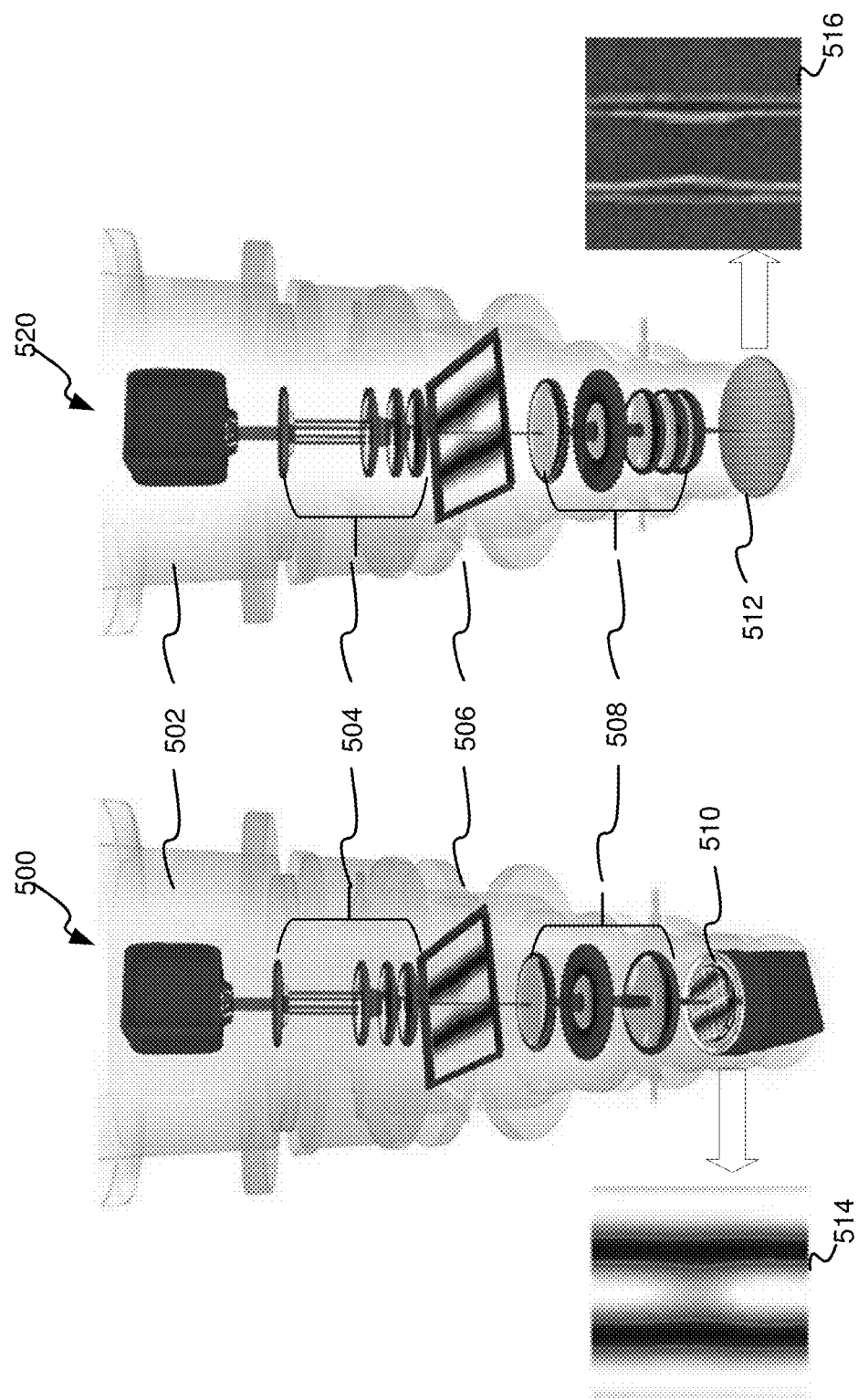
FIG. 5 illustrates a schematic illustration of an actinic inspection tool and a lithographic tool in accordance with certain embodiments of the presently disclosed subject matter.

Turning now to FIG. 5, there is shown a schematic illustration of an actinic inspection tool and a lithographic tool in accordance with certain embodiments of the presently disclosed subject matter.

Similar to a lithographic tool 520, an actinic inspection tool 500 may include an illumination source 502 configured to generate light (e.g., laser) at an exposure wavelength, illumination optics 504, mask holder 506, and projection optics 508. The illumination optics 504 and projection optics 508 may include one or more optical elements (such as, e.g., a lens, aperture, a spatial filter, etc.).

In a lithographic tool 520, a mask is positioned at the mask holder 506 and optically aligned to project an image of the circuit pattern to be duplicated onto a wafer placed on the wafer holder 512 (e.g., by employing various stepping, scanning and/or imaging techniques to produce or replicate the pattern on the wafer). Unlike the lithographic tool 520, instead of placing a wafer holder 512, the actinic inspection tool 500 places a detector 510 (such as, e.g., charge-coupled device (CCD)) at the location of the wafer holder, where the detector 510 is configured to detect the light that is projected through the mask, and generate an image of the mask.

As can be seen, the actinic inspection tool 500 is configured to emulate optical configurations of the lithographic tool 520, including but not limited to, e.g., illumination/exposure conditions such as wavelength, pupil shape, numerical aperture (NA), etc. Therefore, the mask image 514 acquired by the detector 510 is expected to resemble an image 516 of a wafer that is fabricated using the mask via the lithographic tool. A mask image acquired using such an actinic inspection tool is also referred to as an aerial image, or a first image as described in the present disclosure. The first image is provided to system 101 for further processing, as described below.

According to certain embodiments, in some cases, the mask inspection tool 120 can be implemented as a non-actinic inspection tool, such as, e.g., a regular optical inspection tool, an electron beam tool, etc. In such cases, the non-actinic inspection tool can be configured to acquire an image of the mask. Simulation can be performed on the acquired image to simulate the optical configuration of the lithographic tool, thereby generating an aerial image (i.e., a first image). In some cases, the simulation can be performed by the system 101 (e.g., the functionality of the simulation can be integrated into the PMC 102 thereof), while in some other cases, the simulation can be performed by a processing module of the mask inspection tool 120, or by a separate simulation unit which is operatively connected to the mask inspection tool 120 and system 101.

System 101 includes a processor and memory circuitry (PMC) 102 operatively connected to a hardware-based I/O interface 126. PMC 102 is configured to provide processing necessary for operating the system as further detailed with reference to FIGS. 2, 3 and 4, and comprises a processor (not shown separately) and a memory (not shown separately). The processor of PMC 102 can be configured to execute several functional modules in accordance with computer-readable instructions implemented on a non-transitory computer-readable memory comprised in the PMC. Such functional modules are referred to hereinafter as comprised in the PMC.

The processor referred to herein can represent one or more general-purpose processing devices such as a microprocessor, a central processing unit, or the like. More particularly, the processor may be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processor may also be one or more special-purpose processing devices such as an application specific integrated circuit (ASIC), a field programmable gate array (FPGA), a digital signal processor (DSP), a network processor, or the like. The processor is configured to execute instructions for performing the operations and steps discussed herein.

The memory referred to herein can comprise a main memory (e.g., read-only memory (ROM), flash memory, dynamic random access memory (DRAM) such as synchronous DRAM (SDRAM) or Rambus DRAM (RDRAM), etc.), and a static memory (e.g., flash memory, static random access memory (SRAM), etc.).

As aforementioned, in some embodiments, system 101 can be configured to detect defects related to edge displacement of one or more structural elements on a mask. The term "edge displacement" used herein refers to a relatively substantial deviation of the edge/contour of a structural element from an expected position thereof.

A structural element or structural feature used herein can refer to any original object on the mask that has a geometrical shape or geometrical structure with a contour, in some cases combined/superimposed with other object(s) (therefore forming a pattern). Examples of structural elements can include general shape features, such as, e.g., contacts, lines, etc., and/or features having complex structures/shapes, and/or features combined by one or more other features. A structural element can be a 2D or 3D feature, and an image capturing the structural element can reflect a 2D representation of the structural element.

The defect of edge displacement referred to herein may be caused by various factors, such as physical effect(s) during a fabrication process of the mask, and/or other factors such as, e.g., oxidation (which may gradually take place during usage of the mask), particles, scratches, crystals growth, electrostatic discharge (ESD), etc. Such mask defects, if not detected prior to mass production of wafers, will be repeated multiple times on the wafers, and will cause multiple semiconductor devices to be defective (e.g., affecting the functionality of the devices), thus significantly reducing the yield.

A mask comprises a mask field that will be transformed to the wafer. In some cases, a mask field can comprise multiple dies having the same design patterns (such a mask is referred to as a multi-die mask). In some other cases, a mask field can comprise a single die (such a mask is referred to as a single-die mask). In order to detect if there is a defect associated with a structural element in a die, a reference structural element from another die is normally required for purpose of comparison in a die-to-die inspection. However, in cases of the single-die mask, there is no reference die on the mask that can be used for comparison. Therefore, for structural elements in the single die, there is a need to obtain references for the purpose of defect detection.

Figure 6:
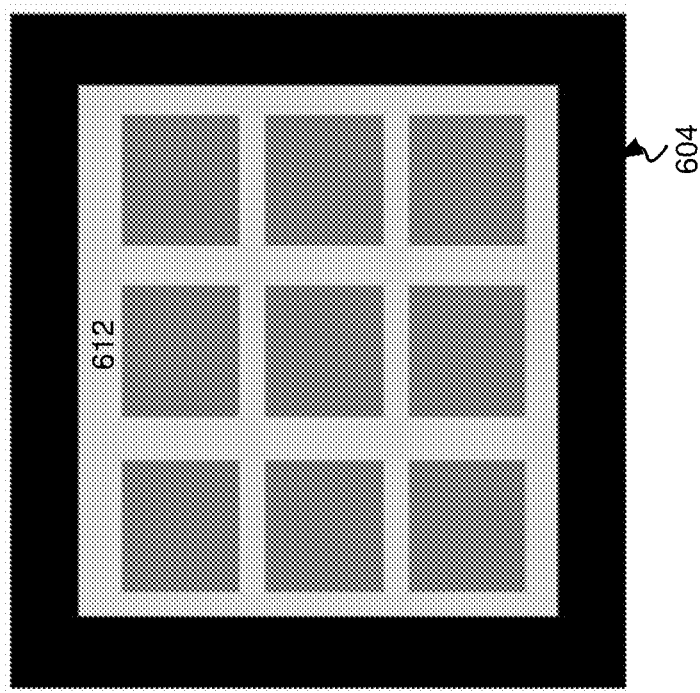
FIG. 6 schematically illustrates an exemplary layout of a single-die mask and an exemplary layout of a multi-die mask in accordance with certain embodiments of the presently disclosed subject matter.
Figure 6:
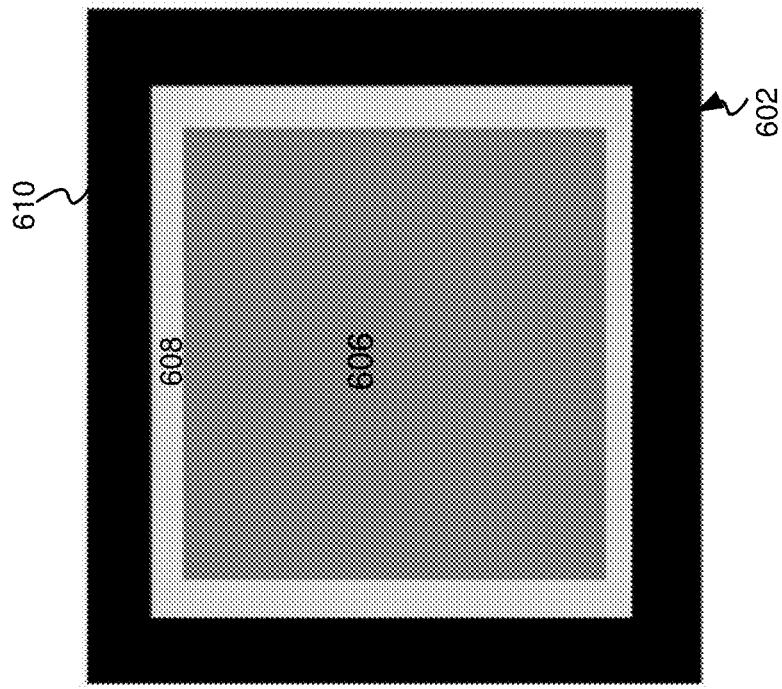

Turning now to FIG. 6, there is schematically illustrated an exemplary layout of a single-die mask and an exemplary layout of a multi-die mask in accordance with certain embodiments of the presently disclosed subject matter.

As shown, the multi-die mask 604 comprises a mask field of nine dies having the same design patterns. For a structural element in any die of the mask field, one or more reference structural elements can always be found in one or more of the neighboring dies. However, for the single-die mask 602 which comprises a mask field of a single die 606, there is no reference die on the mask that can be used for defect detection with respect to the structural elements in the single die.

In addition, the single-die mask 602 further comprises a scribe region 608 between the die area 606 and a peripheral region 610 of the mask. The scribe region 608 contains assisting features such as, e.g., alignment features, calibration features, etc. Such assisting features/structures might be printed on the wafer in the lithography process together with the patterns in the die area. Therefore, it is also desirable to detect defects with respect to these assisting features (if any), additionally or alternatively to defect detection with respect to the structural elements in the dies. This also applies to the assisting features in the scribe region 612 of the multi-die mask 604 which is between the die area and the peripheral region, as well as between the dies. However, there are no reference features for such assisting features on the mask to be used for inspection.

Certain conventional techniques related to an actinic inspection tool may acquire two images respectively from a transmitted modality and a reflected modality of the tool, and analyze the difference between the two images in order to estimate presence of any defect. However, utilizing two imaging modalities may be time-consuming in both the image acquisition process and the image processing process, thus affecting throughput (TpT) of the inspection.

Alternatively, certain inspection tools may attempt to generate a simulated image based on design data of the mask and use the simulated image as a reference image for defect detection on the mask image. However, such methods require the acquisition of the design data of the mask which in many cases is not available. In addition, the simulated image may be inaccurate due to uncertainty of process variations during the mask fabrication process, which may unavoidably affect the accuracy of the inspection result.

Therefore, in particular, due to development of advanced processes and complex features with respect to photomasks, current inspection methodologies are not sufficient for providing desired process control of mask features/elements. An improved defect detection method addressing the above issues is thus required in order to be able to accurately detect defects with respect to the structural elements (e.g., the structural elements in the die area of the single-die mask, as well as in the scribe region of both the single-die mask and the multi-die mask) on the mask, with higher sensitivity, while not affecting the inspection throughput.

According to certain embodiments of the presently disclosed subject matter, there is proposed a new mask inspection system and method for detecting defects related to edge displacement of structural elements on a mask. The proposed method has proved to have improved accuracy and detection sensitivity for advanced process control of the mask features.

According to certain embodiments, the functional modules comprised in PMC 102 of system 101 can include an image processing module 104, a measurement module 106 and, optionally, a defect treatment module 108. The PMC 102 can be configured to obtain, via I/O interface 126, a first image representative of at least part (e.g., a portion) of the mask. The first image can be acquired by emulating an optical configuration lithographic tool usable for fabrication of the semiconductor specimen. By way of example, the image can be acquired by the mask inspection tool 120, such as, e.g., an actinic inspection tool.

The image processing module 104 can be configured to apply a printing threshold on the first image, giving rise to a second image. The second image is informative of a plurality of structural elements of the mask which are printable on the semiconductor specimen. The image processing module 104 can be further configured to estimate a contour for each structural element of interest (SEI) of a group of SEIs from the plurality of structural elements, and extract a set of attributes characterizing the contour, giving rise to a group of contours corresponding to the group of SEIs and respective sets of attributes associated therewith.

The image processing module 104 can be further configured, for each given contour, to identify, among the remaining contours in the group of contours, one or more reference contours similar to the given contour, by comparing between the respective sets of attributes associated therewith. The measurement module 106 can be configured to measure a deviation between the given contour and each of the one or more reference contours thereof, giving rise to one or more measured deviations indicative of whether a defect is present with respect to the SEI associated with the given contour. Optionally, the defect treatment module 108 can be configured to report the presence of a defect upon a deviation crossing the deviation threshold, and/or determine how to respond to the detected defects.

Operations of systems 100, 101, PMC 102 and the functional modules therein, will be further detailed with reference to FIGS. 2, 3 and 4.

According to certain embodiments, system 100 can comprise a storage unit 122. The storage unit 122 can be configured to store any data necessary for operating systems 100 and 101, e.g., data related to input and output of systems 100 and 101, as well as intermediate processing results generated by system 101. By way of example, the storage unit 122 can be configured to store the image(s) produced by the mask inspection tool 120 and/or derivatives thereof (e.g., images after pre-processing). Accordingly, the image(s) can be retrieved from the storage unit 122 and provided to the PMC 102 for further processing.

In some embodiments, system 100 can optionally comprise a computer-based Graphical User Interface (GUI) 124 which is configured to enable user-specified inputs related to system 101. For instance, the user can be presented with a visual representation of the specimen (for example, by a display forming part of GUI 124), including images of the specimen and/or image representation of the structural elements. The user may be provided, through the GUI, with options of defining certain operation parameters, such as, e.g., a printing threshold, a deviation threshold, etc. In some cases, the user may also view operation results, such as the measured deviations, detected defects, and/or further examination results on the GUI.

As described above, system 101 is configured to receive, via I/O interface 126, one or more images (e.g., the first images) of the mask. The images can include image data (and/or derivatives thereof) produced by the mask inspection tool 120 and/or image data stored in the storage unit 122 or one or more data depositories. In some cases, image data can refer to images captured by the mask inspection tool during or after the mask fabrication process, and/or pre-processed images derived from the captured images as obtained by various pre-processing stages, etc. It is noted that in some cases the images can include associated numeric data (e.g., metadata, hand-crafted attributes, etc.). It is further noted that the image data relates to a target layer of a semiconductor device to be printed on the wafer.

System 101 is further configured to process the received images and send, via I/O interface 126, the results (e.g., the measured deviations, the detected defects) to the storage unit 122, and/or the GUI 124 for rendering, and/or the mask inspection tool 120.

In some embodiments, additionally to system 101, the mask inspection system 100 can further comprise one or more inspection modules, such as, e.g., additional defect detection module(s) and/or Automatic Defect Review Module (ADR) and/or Automatic Defect Classification Module (ADC) and/or metrology-related module and/or other inspection modules which are usable for performing additional inspection of a mask. The one or more inspection modules can be implemented as stand-alone computers, or their functionalities (or at least some thereof) can be integrated with the mask inspection tool 120. In some embodiments, the output as obtained from system 101 can be used by the mask inspection tool 120 and/or the one or more inspection modules (or part thereof) for further inspection of the mask.

Those versed in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and/or hardware.

It is noted that the examination system illustrated in FIG. 1 can be implemented in a distributed computing environment, in which the aforementioned functional modules as comprised in the PMC 102 can be distributed over several local and/or remote devices, and can be linked through a communication network. It is further noted that in other embodiments at least some of the examination tool(s) 120, storage unit 122 and/or GUI 124 can be external to the examination system 100 and operate in data communication with system 101 via I/O interface 126. System 101 can be implemented as stand-alone computer(s) to be used in conjunction with the examination tools. Alternatively, the respective functions of the system 101 can, at least partly, be integrated with the mask inspection tool 120, thereby facilitating and enhancing the functionalities of the mask inspection tool 120 in inspection-related processes.

Figure 2:
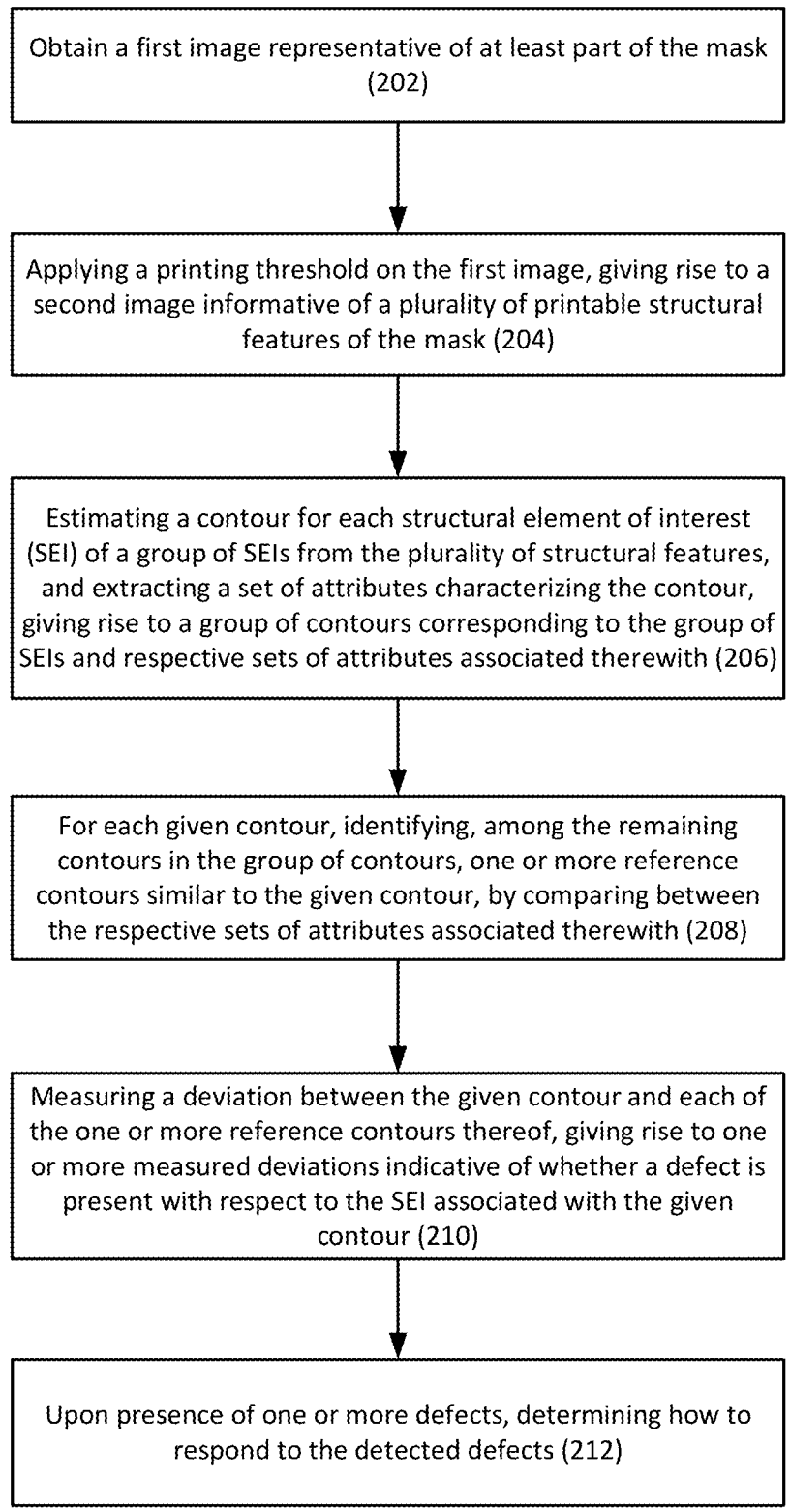
FIG. 2 illustrates a generalized flowchart of mask inspection in accordance with certain embodiments of the presently disclosed subject matter.
Figure 3:
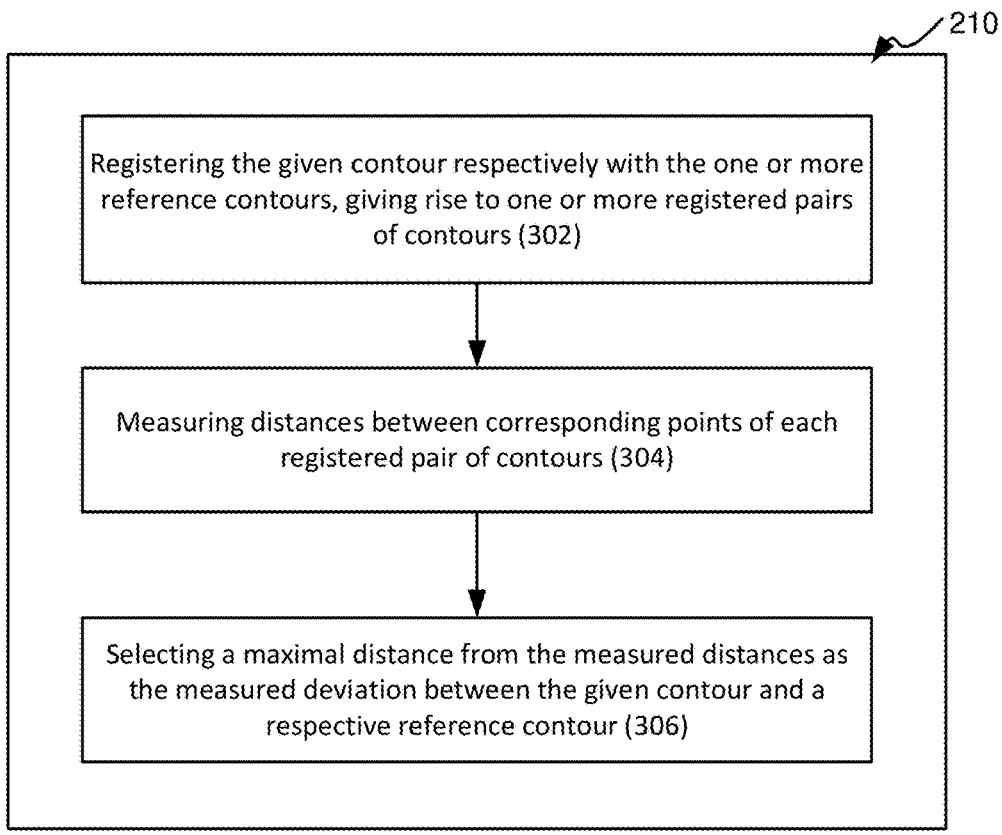
FIG. 3 illustrates a generalized flowchart of measuring a deviation between a given contour and the reference contours thereof in accordance with certain embodiments of the presently disclosed subject matter.
Figure 4:
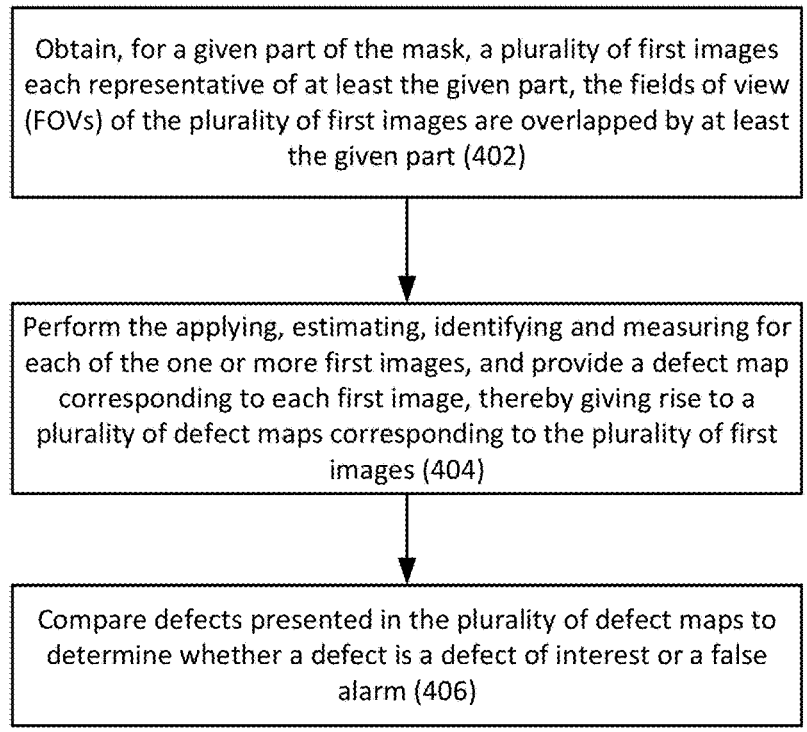
FIG. 4 illustrates a generalized flowchart of acquiring and utilizing overlapped images for false alarm removal in accordance with certain embodiments of the presently disclosed subject matter.

While not necessarily so, the process of operation of systems 101 and 100 can correspond to some or all of the stages of the methods described with respect to FIGS. 2-4. Likewise, the methods described with respect to FIGS. 2-4 and their possible implementations can be implemented by systems 101 and 100. It is therefore noted that embodiments discussed in relation to the methods described with respect to FIGS. 2-4 can also be implemented, mutatis mutandis as various embodiments of the systems 101 and 100, and vice versa.

Referring now to FIG. 2, there is illustrated a generalized flowchart of mask inspection in accordance with certain embodiments of the presently disclosed subject matter.

A first image representative of at least part of a mask (a mask to be inspected) can be obtained (202) (e.g., by the PMC 102 via I/O interface 126, from the mask inspection tool 120 or from the storage unit 122). The first image can be acquired by emulating optical configuration of a lithographic tool usable for fabrication of the semiconductor specimen.

In some embodiments, the mask to be inspected is a single-die mask. As exemplified in 602 of FIG. 6, the mask field of the single-die mask, including the die area of the single die and the scribe region (containing assisting features such as, e.g., alignment features, calibration features, etc.), comprise printable features/structures that will be transferred onto the wafer during the lithography process. Therefore, the presently proposed inspection method is applicable to detect defects with respect to any of these regions/areas. By way of example, the first image as obtained can be representative of at least part of the single die area and/or at least part of the scribe region.

In some other embodiments, the mask to be inspected can be a multi-die mask, as exemplified in 604 of FIG. 6. In such cases, the presently proposed inspection method is applicable to detect defects with respect to at least part of the scribe region in the multi-die mask.

In some embodiments, the first image is acquired by an actinic mask inspection tool, such as, e.g., the Aera Mask Inspection tool of Applied Materials Inc. As described above with reference to FIG. 5, the actinic mask inspection tool is specifically configured to emulate the optical configurations of a lithographic tool (e.g., a scanner or a stepper) used for fabrication of the semiconductor wafers in accordance with the mask. The optical configurations to be emulated can include one or more of the following illumination/exposure conditions such as, e.g., wavelength, pupil shape, numerical aperture (NA), etc.

The mask image (e.g., the first image) acquired by such actinic inspection tool is expected to resemble an image of a wafer that is fabricated using the mask via the lithographic tool, thus is also referred to as an aerial image. In other words, the actinic mask inspection tool is configured so as to capture a mask image which can mimic how the design patterns in the mask would actually appear in a physical wafer after the fabrication process.

In some cases, an actinic inspection tool may not be available for inspecting the mask. In such cases, a non-actinic inspection tool, such as, e.g., a regular optical inspection tool, an electron beam tool, etc., can be used to acquire an image (a non-aerial image) of the mask. Simulation can be performed on the acquired non-aerial image to simulate the optical configurations of the lithographic tool, thereby generating an aerial image/first image of the mask. Accordingly, in some embodiments, the mask inspection method as described with reference to FIG. 2 can further comprise the preliminary steps of obtaining an image acquired by a non-actinic inspection tool, and performing simulation (e.g., by the image processing module 104 of PMC 102, or by a processing module of the mask inspection tool 120, etc.) on the image to simulate the optical configuration of the lithographic tool, giving rise to the first image.

In some embodiments, the first image as obtained may be pre-processed prior to the further processing, as will be described with reference to FIG. 2. The pre-processing may include one or more of the following operations: interpolation (e.g., in case of the first image having a relatively low resolution), noise filtration, focus corrections, aberration compensation, image format transformation, etc.

It is to be noted the present disclosure is not limited to the specific modality of the mask inspection tool, and/or the type of images acquired thereby, and/or the pre-processing operations required for processing the images.

A printing threshold can be applied (204) (e.g., by the image processing module 104 of PMC 102) on the first image, giving rise to a second image. The second image is informative of a plurality of structural elements of the mask which are printable on the semiconductor specimen.

Figure 7:
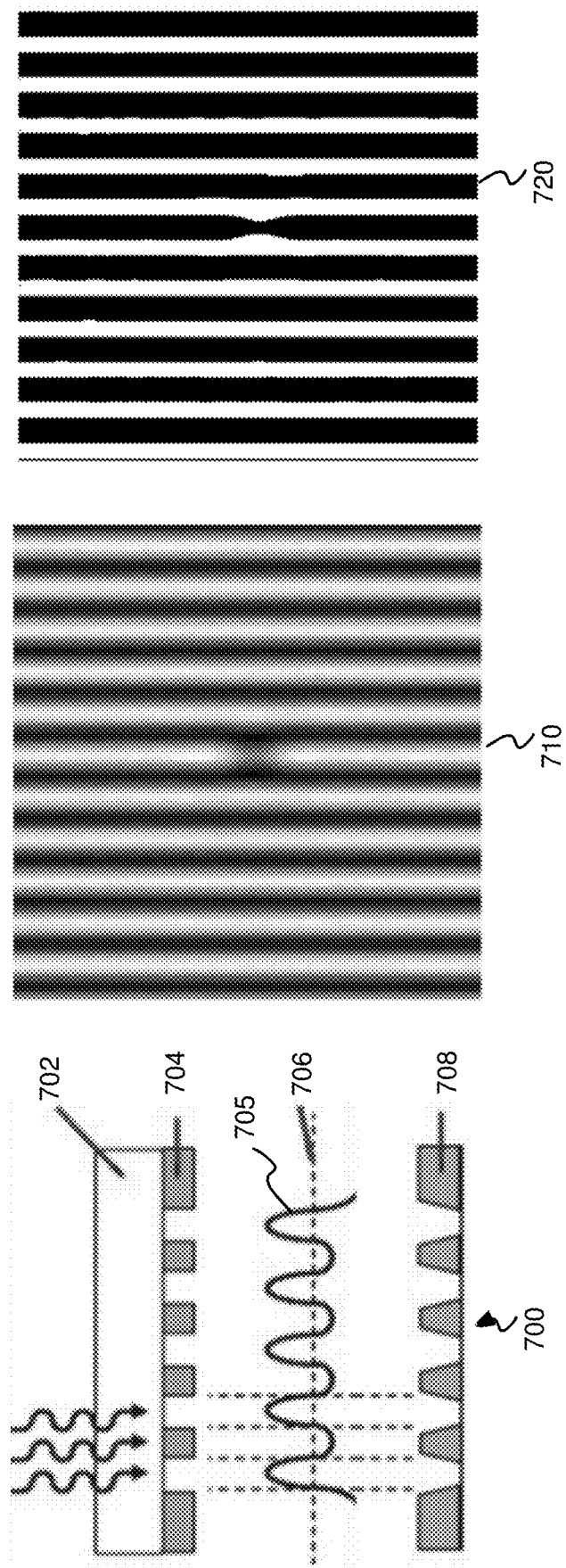
FIG. 7 shows a schematic illustration of the process of applying a printing threshold, as well as examples of a first image and a second image in accordance with certain embodiments of the presently disclosed subject matter.

Referring now to FIG. 7, there is shown a schematic illustration of the process of applying a printing threshold, as well as examples of a first image and a second image in accordance with certain embodiments of the presently disclosed subject matter.

As shown, the illustration 700 demonstrates an exemplified (and simplified) mask comprising a transparent area 702 (e.g., made of quartz) which, upon illumination, transmits the light, and an opaque area 704 (e.g., made of chrome) which blocks the light. The first image (aerial image) obtained as described above refers to an image that is captured by a detector collecting the transmitted light through the mask, as exemplified by image 710.

In fact, the actual wafer fabrication process by the fabrication tool (e.g., the scanner or stepper) includes a resist process and an etch process following the lithography process. The wafer is coated with photoresist which is a photosensitive material. Exposure to the light causes sections of the resist to either harden or soften, depending on the process. After exposure, the wafer is developed, causing the photoresist to dissolve in certain areas according to the amount of transmitted light (i.e., the light intensity) the areas received during exposure.

By way of example, a waveform 705 representative of the intensity of the transmitted light is illustrated. The patterns will be printed on the wafer if the photoresist at a given area is exposed below a specific intensity of the transmitted light. These areas of photoresist and no photoresist reproduce the design patterns on the mask. The specific intensity is therefore known as a printing threshold 706, as exemplified in FIG. 7. The developed wafer is then exposed to solvents which etch away the silicon in the parts of the wafer that are no longer protected by the photoresist coating, giving rise to a printed wafer 708 (for a given layer).

Accordingly, in the actinic inspection tool that mimics the optical configuration of the wafer fabrication tool, the waveform 705 represents the transmitted light that will be captured by the detector of the actinic inspection tool to form the first image. Since in the actinic inspection tool, the detector replaced the wafer and there is no actual resist and etching process, in order to obtain an image that resembles the printed wafer, a printing threshold 706 needs to be applied to the first image to mimic the effect of the resist and etching process, giving rise to a second image which comprises the printable features on the wafer. Specifically, the second image is a binary image informative of a plurality of structural elements of the mask which are printable on the wafer.

FIG. 7 illustrates examples of a first image 710 and a corresponding second image 720 generated after applying a printing threshold to the first image. As shown, the second image 720 is a binary image resembling the printed patterns on the wafer 708. It is to be noted that although in the present example, the patterns below the printing threshold are illustrated as printable on the wafer (i.e., positive resist), this is not necessarily so. In some other cases, it could be the opposite, i.e., the patterns above the printing threshold are printable on the wafer (i.e., negative resist). The present disclosure is not limited to the specific resist process, nor the specific application of the printing threshold, for rendering the printable features.

Continuing with the description of FIG. 2, a contour for each structural element of interest (SEI) of a group of SEIs from the plurality of structural elements can be estimated, and a set of attributes characterizing the contour can be extracted (206) (e.g., by the image processing module 104 of PMC 102), giving rise to a group of contours corresponding to the group of SEIs and respective sets of attributes associated therewith.

According to certain embodiments, a group of structural elements of interest (SEIs) can be selected from the plurality of structural elements, and the contour estimation can be performed for each SEI in the group. By way of example, the group of SEIs can be selected based on one or more of the following factors: location of the structural elements on the second image, the type and/or shape of the structural elements, structural elements as detected in a previous inspection as defect candidates, customer input/feedback regarding the importance of certain structural elements to be inspected, etc. In some cases, the selection can be skipped, and the group of SEIs can actually comprise the entire population of the plurality of structural elements on the second image.

The term contour can refer to an outline or boundary of an object or element. Contour estimation can be generally used to detect various objects/elements in an image. In some embodiments of the present disclosure, the contour of a structural element can be estimated by using an edge detection method. By way of example, the edge detection method can be implemented using the Canny or Sobel edge detection algorithm. Another example of an edge detection algorithm applicable to the present subject matter is described in U.S. Pat. No. 9,165,376 titled "System, method and computer readable medium for detecting edges of a pattern" which is assigned to the assignee of the present patent application and incorporated herein in its entirety by reference. FIG. 8A illustrates a few examples of extracted contours (marked by dashed lines) for a few structural elements having different shapes in accordance with certain embodiments of the presently disclosed subject matter.

For each contour, a set of attributes characterizing the contour can be extracted. By way of example, the set of attributes can be selected from a group comprising: an area formed by the contour, width of the area, height of the area, number of pixels along the contour, chain code, and center of gravity, etc. For instance, a chain code is used to represent a contour by a connected sequence of straight-line segments of specified length and direction. Typically, this representation is based on 4 or 8 connectivity of the segments. The direction of each segment is coded by using a numbering scheme. A contour code formed as a sequence of such directional numbers is referred to as a chain code which is indicative of the shape of the contour.

By way of example, the set of attributes for each contour of the group of contours can be represented in different data formats, such as, e.g., a table, vectors, lists, etc. For instance, a table representation can comprise N rows each representing a specific contour of the group of N contours, and K columns each representing the set of K features associated with the contours.

For each given contour of the group of contours, one or more reference contours similar to the given contour can be identified (208) (e.g., by the image processing module 104 of PMC 102) among the remaining contours (i.e., candidate contours) in the group of contours. In some embodiments, the one or more reference contours can be identified by comparing the set of attributes associated with the given contour with respective sets of attributes associated with at least some of the remaining contours. The comparison can be based on a similarity measure, and the one or more contours that meet a similarity criterion can be identified as the reference contours similar to the given contour.

By way of example, the similarity measure can be a distance-based metric, such as, e.g., Euclidean distance, Manhattan distance, Cosine distance, Pearson Correlation distance, Spearman correlation distance, etc. The similarity criterion can be a predetermined distance. In some cases, the number of reference contours to be identified can also be predetermined.

For instance, the comparison can be performed by, e.g., starting from the first candidate contour in the table, calculating a distance between each pair of attribute sets of the given contour and a candidate contour from the remaining contours, and upon the number of reference contours whose distances meet the similarity criterion being satisfied, the process ends, and the reference contours as identified will be provided.

Alternatively, in another example, the comparison can be performed by calculating a distance for each candidate contour in the remaining contours with respect to the given contour, and selecting the predetermined number of reference contours by ranking the calculated distances. In some cases, the number of reference contours to be identified are not predetermined. All the candidate contours whose distances meet the similarity criterion can be identified as reference contours.

Figure 8B:
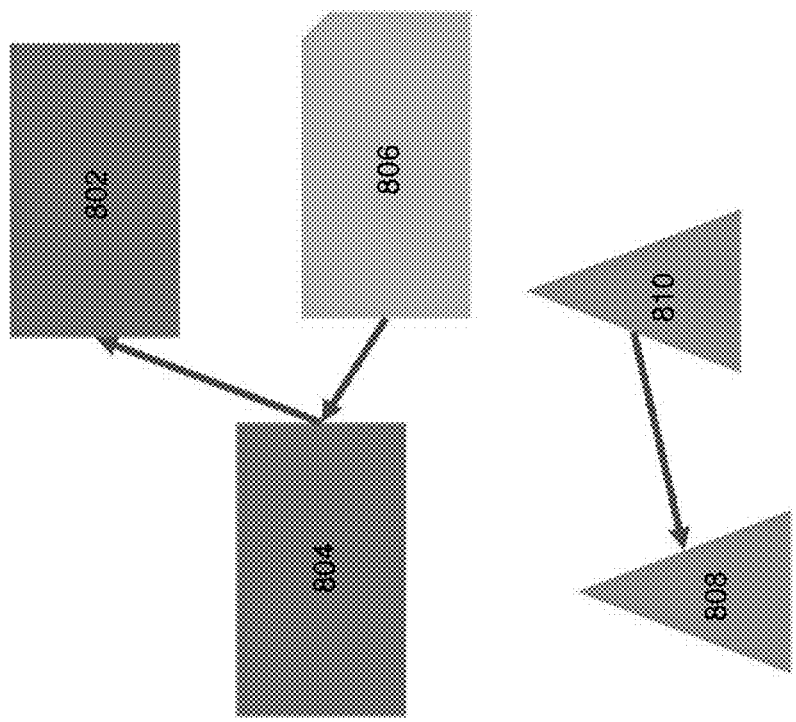
FIG. 8B illustrates examples of reference contours for given contours in accordance with certain embodiments of the presently disclosed subject matter.
Figure 8A:
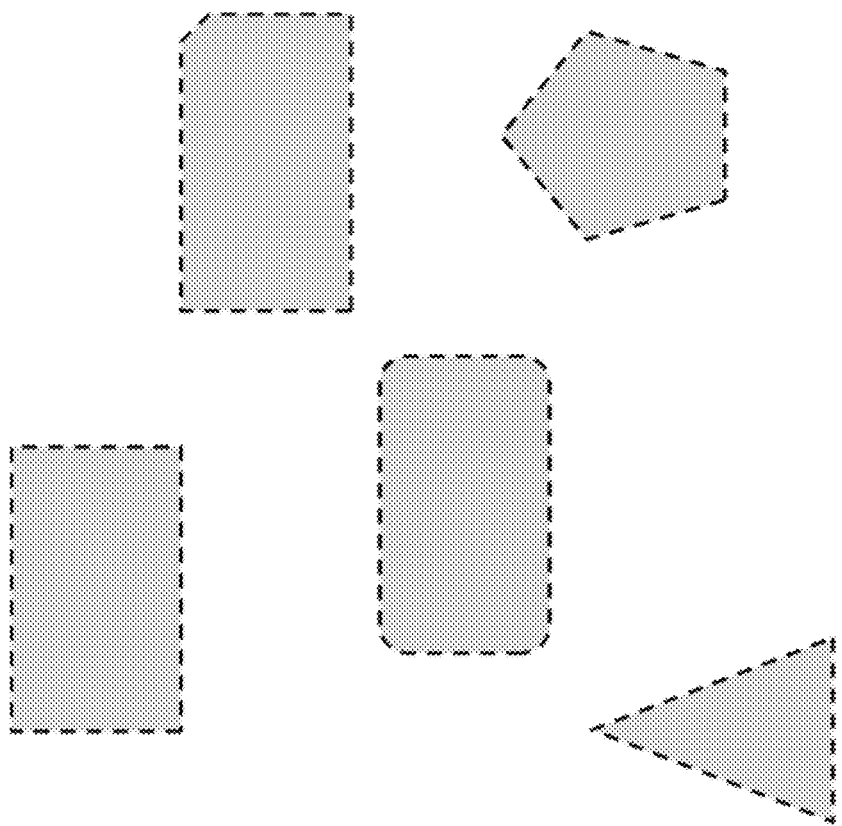
FIG. 8A illustrates a few examples of extracted contours (marked by dashed lines) for a few structural elements having different shapes in accordance with certain embodiments of the presently disclosed subject matter.

Referring to FIG. 8B, there are illustrated examples of reference contours for given contours in accordance with certain embodiments of the presently disclosed subject matter.

Assume the number of reference contours to be identified for each given contour is one. By way of example, for contour 804, the reference contour that is identified to meet the similarity criterion is contour 802. For contour 806, the reference contour that is identified to meet the similarity criterion is contour 804 or 802. If the number of reference contours is predetermined to be two, then both contours 802 and 804 can be used as the reference contours for contour 806. For contour 810, the reference contour thereof is contour 808.

Continuing with the description of FIG. 2, a deviation between the given contour and each of the one or more reference contours thereof can be measured (210) (e.g., by the measurement module 106 of the PMC 102), giving rise to one or more measured deviations indicative of whether a defect is present with respect to the SEI associated with the given contour.

The defect to be detected herein refers to an edge displacement indicative of a relatively substantial deviation of the given contour from an expected position thereof (e.g., the position of the contour as expected to be according to its original design data, or according to the identified reference contours). The edge displacement differs from edge roughness (which may be caused by different variations in the fabrication process) at least in that: i) the edge displacement is local (which is present at a local position of the contour), whereas the edge roughness is present all along the edges, and ii) the amplitude of the deviation of the edge displacement is relatively more substantial (i.e., stronger/larger) as compared to the amplitude of the subtle roughness along the edges.

Such edge displacement may be caused, in some cases, by certain physical effects during the fabrication process of the mask and/or other factors, such as, e.g., oxidation, particles, scratches, crystals growth, electrostatic discharge (ESD) etc, which, upon being printed on the wafer, may affect electrical measurements of the fabricated devices, thus possibly causing yield decrease and device performance failure. Therefore, it is necessary to detect such displacement defects and measure the amplitude thereof.

Turning now to FIG. 3, there is illustrated a generalized flowchart of measuring a deviation between a given contour and the reference contours thereof in accordance with certain embodiments of the presently disclosed subject matter.

Specifically, the given contour can be respectively registered (302) with the one or more reference contours, giving rise to one or more registered pairs of contours. By way of example, the registration can be performed by aligning the center of gravity and/or certain anchor points of the given contour and the reference contour. Distances between corresponding points of each registered pair of contours can be measured (304). By way of example, the distances can be measured using a Hausdorff distance metric. A maximal distance can be selected (306) from the measured distances which is used as the measured deviation between the given contour and a respective reference contour (of the one or more reference contours).

In some embodiments, a combined deviation can be derived based on the one or more measured deviations between the given contour and the one or more reference contours, and a deviation threshold can be applied to the combined deviation. Presence of a defect can be reported (e.g., by the defect treatment module 108 of the PMC 102) upon the combined deviation crossing the deviation threshold. By way of example, the combined deviation can be derived by averaging (or weighted averaging) the one or more measured deviations, such as, e.g., mean or median or any other kinds of averaging calculations (with or without weights) of the deviations.

By way of example, three reference contours of the given contour can be identified, and three deviations are respectively measured between the given contour and the three reference contours. The three deviations can be averaged to generate a combined deviation which will be compared to the deviation threshold. In some cases, the deviation threshold can be predetermined in accordance with, e.g., the specific inspection application, the type of structural elements, technology node and/or specs used by the customer, etc.

Figure 9:
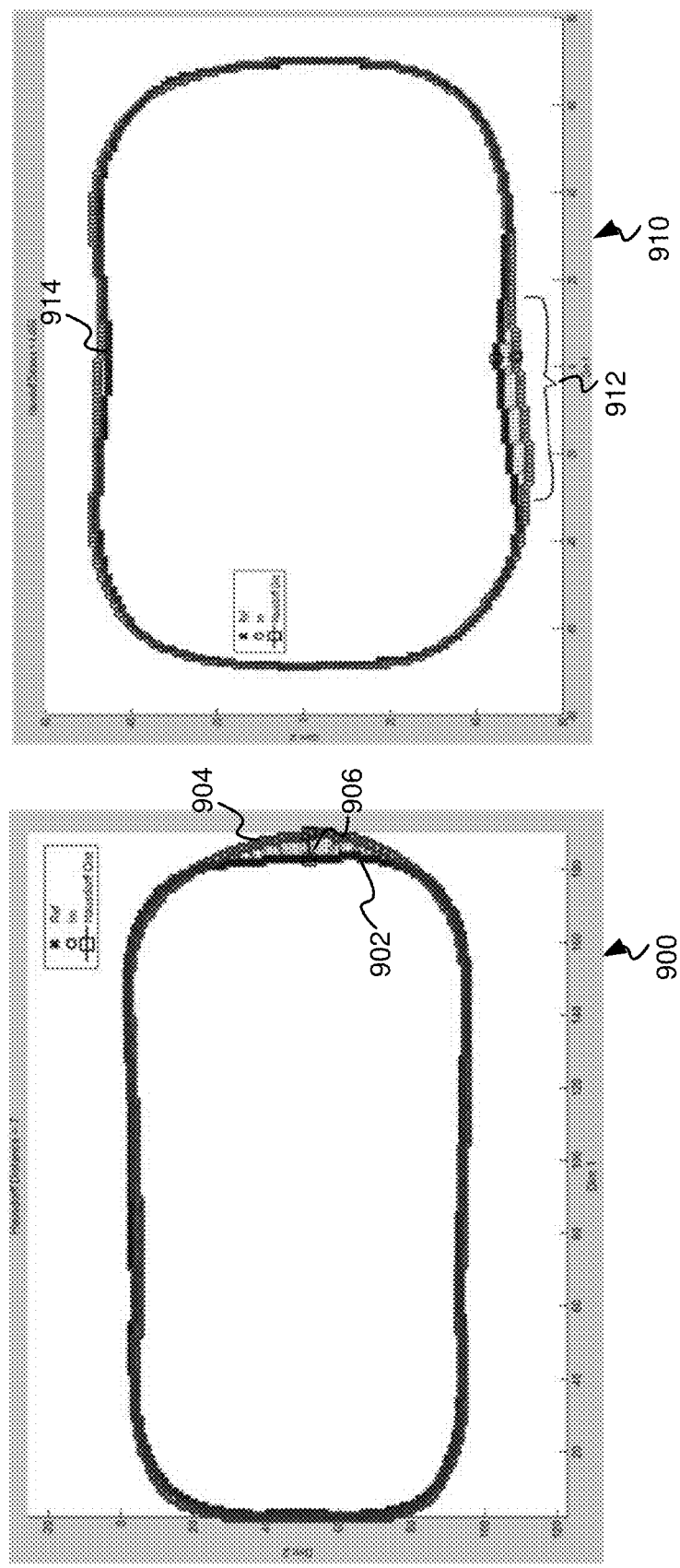
FIG. 9 illustrates two examples of measured deviations indicative of the presence of defects in accordance with certain embodiments of the presently disclosed subject matter.

Referring now to FIG. 9, there are illustrated two examples of measured deviations indicative of presence of defects in accordance with certain embodiments of the presently disclosed subject matter.

Graph 900 illustrates an estimated contour 904 of a structural element having an oval shape, and a reference contour 902 as identified for the contour 904 and representative of an expected position of the contour of a defect-free structural element. As shown, the two contours are registered, and a maximal distance 906 is measured as the deviation between the given contour 904 and the reference contour 902. The deviation is larger than a predetermined deviation threshold, thus a defect of edge displacement is identified at the location of the measurement.

Graph 910 illustrates another example where a defect of edge displacement is identified at the location of 912, which as compared to the edge roughness 914 as illustrated, is relatively more substantial, thus crossing the deviation threshold.

According to certain embodiments, once the defect detection has been performed for each SEI of the group of SEIs, a defect map can be provided corresponding to the first image and indicative of the presence of defects on the at least part of the mask and locations thereof.

In some embodiments, optionally, upon presence of one or more defects, it can be determined (212) (e.g., by the defect treatment module 108 of the PMC 102) how to respond to the detected defects, e.g., by evaluating their printability, or evaluating whether these defects, upon being printed, will affect the functionality of a semiconductor specimen manufactured using the mask. By way of example, the evaluation can include estimating variations of a printable structural element/feature that is associated with a defect when being printed on the semiconductor specimen. By way of example, the possible treatment operations in response to presence of defects can include: repairing the mask, defining the mask as a faulty mask, defining the mask as functional, generating a repair indication of the mask, and the like. For instance, if these estimated variations are not acceptable, then the mask can be sent to the mask shop to be repaired or rejected.

Additionally, in some embodiments, at least one of the following output/indications, or any combination thereof can be provided (e.g., by the defect treatment module 108 of the PMC 102): (i) providing a qualification criteria for a mask to be shipped out of a mask shop; (ii) providing input to a mask generation process; (iii) providing input to a semiconductor specimen manufacturing process; (iv) providing input to a simulation model used in a lithographic process; (v) providing correction maps for a lithography tool; and (vi) identifying areas on the mask that are characterized by feature parameter variations which are larger than expected.

According to certain embodiments, during inspection, the mask holder and the detector of the mask inspection tool can be moved in opposite directions to each other during the exposure, and the mask can be scanned step-by-step by the mask inspection tool which images only a portion of the mask at a time. Therefore, a plurality of first images of the mask can be sequentially obtained, each representative of a respective part of the mask. According to certain embodiments, the plurality of first images can be acquired consecutively with a step size which is predefined such that the plurality of fields of view (FOVs) of the plurality of first images are not overlapped.

Figure 10B:
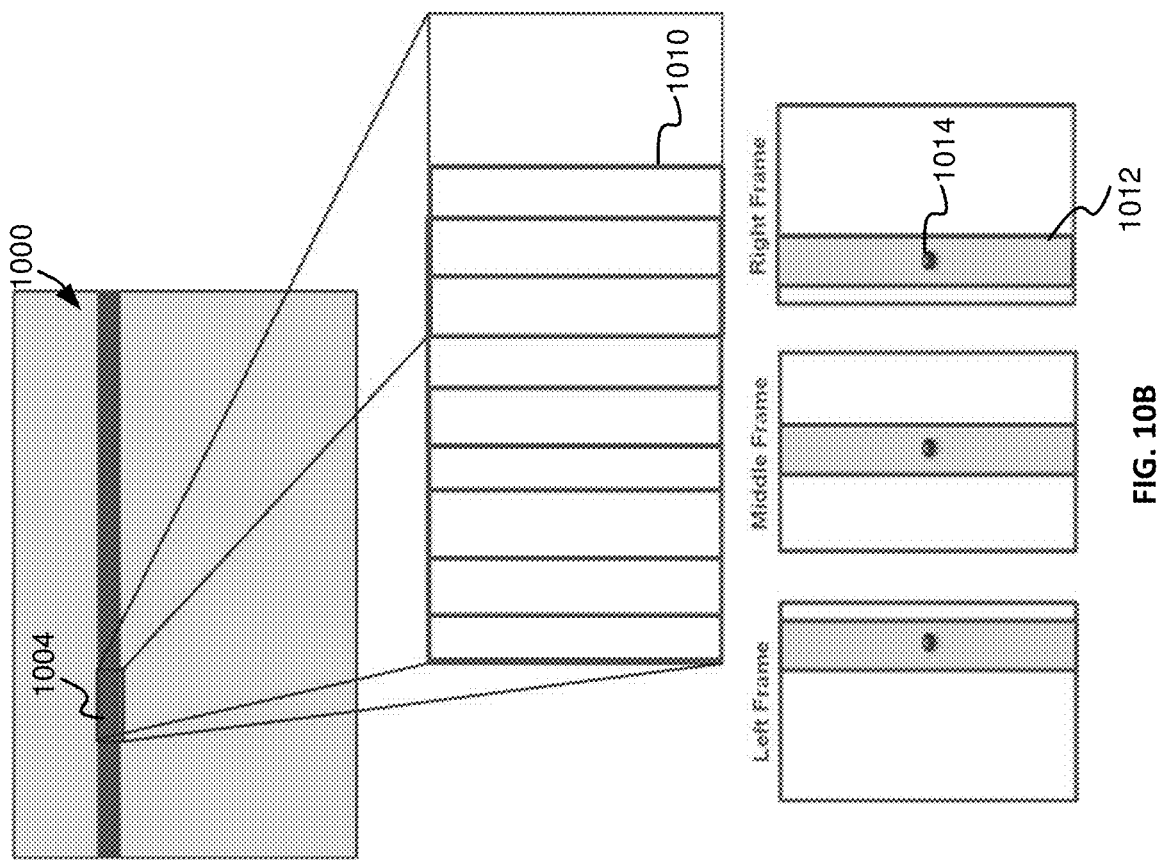
FIG. 10B schematically illustrates an example of a sequence of overlapped images captured for a portion of the mask in accordance with certain embodiments of the presently disclosed subject matter.
Figure 10A:
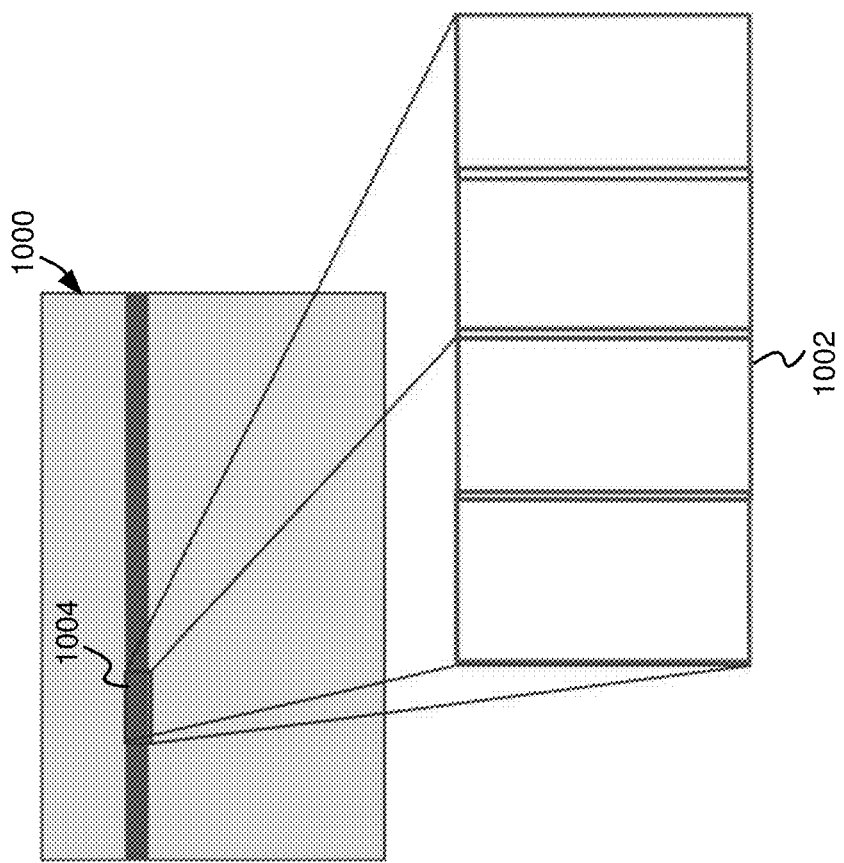
FIG. 10A schematically illustrates an example of a sequence of non-overlapped images captured for a portion of the mask in accordance with certain embodiments of the presently disclosed subject matter.

FIG. 10A schematically illustrates an example of a sequence of non-overlapped images captured for a portion of the mask in accordance with certain embodiments of the presently disclosed subject matter. As shown, a sequence of four first images 1002 are acquired for a portion 1004 of a mask 1000. The four first images are captured with such a step size that their FOVs are not overlapped, but rather together constitute the FOV of the entire portion 1004.

In such cases, the sequence of operations as described with respect to blocks 204-210 of FIG. 2 can be performed repetitively for each of the plurality of first images, giving rise to a defect map corresponding to each of the plurality of first images and indicative of the presence of defects on a respective part of the mask. A plurality of defect maps can be obtained corresponding to the plurality of first images.

In some cases, there may be false alarms in the detected defects due to the existence of unique structural elements in a first image. By way of example, there may be one structural element with a unique shape of contour in a first image which does not have a reference contour that has a similar shape thereto. In such cases, the inspection process may find no reference for this structural element, thus reporting it as a defect, or, alternatively, it may use reference contours which are actually not that similar to the element for comparison, thus also reporting it as a defect. In such cases, these reported defects are false alarms, since they actually represent existence of unique structural elements rather than real defects. In some cases, another instance of such a unique structural element may appear in the subsequent images. Therefore, by comparing the detected defects among the plurality of first images, such false alarms can be identified and removed from the detected defects.

Specifically, according to certain embodiments, one or more SEIs associated with a defect (or defects), as presented in each of the plurality of defect maps, can be identified, and the one or more contours of the one or more SEIs can be compared between the plurality of first images. The comparison can be performed in a similar manner as described above with reference to block 208, e.g., by comparing the set of attributes associated with the SEIs. It can be then determined whether at least one defect is a false alarm indicative of the presence of a unique structural element in at least one of the first images, based on the comparison result. By way of example, per comparison, if a structural element which is reported to be associated with a defect has a similar instance in the subsequent images, the defect is most likely a false alarm which actually indicates the presence of a unique structural element.

In some further cases, there may be false alarms in the detected defects which are caused by tool noises (e.g., such as the shot noise from the inspection tool). In order to remove such false alarms from the defects, thus improving detection sensitivity, there is proposed a way of acquiring and utilizing overlapped images for false alarm removal as described with reference to FIG. 4 in accordance with certain embodiments of the presently disclosed subject matter.

Specifically, in some embodiments, a plurality of first images can be obtained (402) for a given part of the mask, each first image representative of at least the given part. The plurality of first images can be acquired consecutively with a step size which is predefined such that the plurality of fields of view (FOVs) of the plurality of first images are overlapped by at least the given part.

FIG. 10B schematically illustrates an example of a sequence of overlapped images captured for a portion of the mask in accordance with certain embodiments of the presently disclosed subject matter. As shown, a sequence of first images 1010 are acquired for the same portion 1004 of the mask 1000. The sequence of first images are captured with a specific step size such that their FOVs are overlapped by, e.g., a third of the FOV of an image. For instance, a given part 1012 of the mask is acquired three times in the three consecutive images. Therefore, a real defect 1014 (i.e., defect of interest) that is present in the given part 1012 of the mask will naturally appear three times in the three images, whereas false alarms resulting from random noises will not repeat in the consecutive images.

Accordingly, the sequence of operations as described with respect to blocks 204-210 of FIG. 2 can be performed for each of the plurality of first images, and a defect map can be provided (404) corresponding to each of the plurality of first images and indicative of the presence of defects on the at least given part, thereby giving rise to a plurality of defect maps corresponding to the plurality of first images. Defects presented in the plurality of defect maps can be compared (406) to determine whether a defect is a defect of interest or a false alarm.

Figure 11:
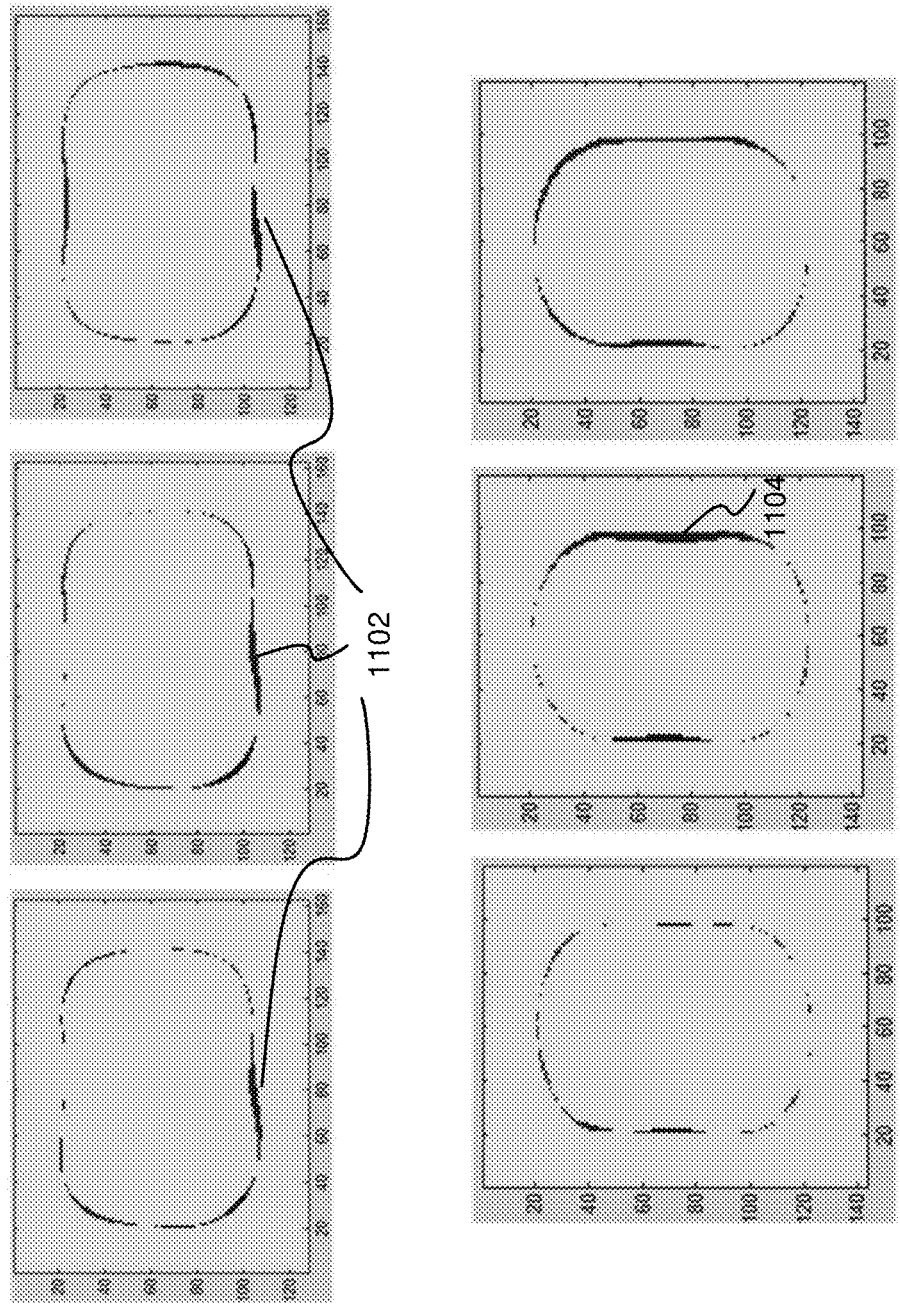
FIG. 11 illustrates examples of a defect of interest and a false alarm determined using overlapped images in accordance with certain embodiments of the presently disclosed subject matter.

Turning now to FIG. 11, there are illustrated examples of a defect of interest and a false alarm determined using overlapped images in accordance with certain embodiments of the presently disclosed subject matter.

As shown in the upper sequence of three consecutive images that capture the same structural element, per comparison of the detected defects, a defect 1102 is present in all the three images and appears in each image at the same location with respect to the structural element. Therefore, it can be determined that defect 1101 is a defect of interest. On the contrary, as shown in the lower sequence of three consecutive images that capture the structural element, a defect 1104 is only present in the second image, but is absent in the first and third images. Therefore, the defect 1104 is most likely to be a false alarm which may be caused by random noises (e.g., shot noises). Such false alarms should be removed from the defect map.

It is to be noted that the mask that is applicable to the presently disclosed inspection method can be any kind of mask that may suffer from the type of defect of edge displacement as described herein, including but not limited to memory masks and/or logic masks, and/or Arf masks and/or EUV masks, etc. The present disclosure is not limited to a specific type or functionality of the masks to be inspected.

For exemplary and illustrative purposes, certain embodiments and/or examples of the presently disclosed subject matter herein are described with respect to structural elements with specific types/shapes, and/or specific edge displacements. This is by no means intended to limit the present disclosure in any way. It is appreciated that the proposed methods and systems can be applied to other types/shapes of structural elements with various kinds of edge displacements.

According to certain embodiments, the mask inspection process as described above with reference to FIGS. 2, 3 and 4 can be included as part of an inspection recipe usable by system 101 and/or the inspection tool 120 for online mask inspection in runtime. Therefore, the presently disclosed subject matter also includes a system and method for generating an inspection recipe during a recipe setup phase, where the recipe comprises the steps as described with reference to FIGS. 2, 3 and 4 (and various embodiments thereof). It is to be noted that the term "inspection recipe" should be expansively construed to cover any recipe that can be used by an inspection tool for performing operations related to any kind of mask inspection including the embodiments as described above.

It is to be noted that examples illustrated in the present disclosure, such as, e.g., the mask inspection tool architectures and configurations, the mask layouts, the exemplified structural elements, and the specific ways of comparison and measurement of the deviation as described above, etc., are illustrated for exemplary purposes, and should not be regarded as limiting the present disclosure in any way. Other appropriate examples/implementations can be used in addition to, or in lieu of the above.

Among advantages of certain embodiments of the mask inspection process as described herein is the capability of detecting a specific type of defect (i.e., edge displacement) with respect to structural elements on a mask. The proposed process is designed in particular for a single-die mask where there is no reference die usable for die-to-die comparison. In addition, the proposed process is also applicable for inspecting the scribe region in both single-die masks and multi-die masks.

Among advantages of certain embodiments of the mask inspection process as described herein is that the proposed inspection process does not require image acquisition from different modalities for the purpose of providing reference images which may be time-consuming. It also does not require acquisition of the design data of the mask (which in many cases is not available) or simulation based on the design data which tend to be inaccurate. The proposed process utilizes specific processing of an aerial image to provide references within the image itself, which has proved to have improved accuracy and sensitivity for defect detection in advanced process control of the mask features, while not affecting throughput (TpT).

Among advantages of certain embodiments of the mask inspection process as described herein is that by acquiring and utilizing overlapped images of the mask, false alarms caused by random noises can be effectively removed, thus further improving detection sensitivity without having to adjust the deviation threshold.

It is to be understood that the present disclosure is not limited in its application to the details set forth in the description contained herein or illustrated in the drawings.

It will also be understood that the system according to the present disclosure may be, at least partly, implemented on a suitably programmed computer. Likewise, the present disclosure contemplates a computer program being readable by a computer for executing the method of the present disclosure. The present disclosure further contemplates a non-transitory computer-readable memory tangibly embodying a program of instructions executable by the computer for executing the method of the present disclosure.

The present disclosure is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the present disclosure as hereinbefore described without departing from its scope, defined in and by the appended claims.

What is claimed is:

1. A computerized system of inspecting a mask usable for fabricating a semiconductor specimen, the system comprising a processing and memory circuitry (PMC) configured to:
    obtain a first image representative of at least part of the mask, wherein the first image is acquired by emulating optical configuration of a lithographic tool usable for fabrication of the semiconductor specimen;
    apply a printing threshold on the first image, giving rise to a second image, wherein the second image is informative of a plurality of structural elements of the mask which are printable on the semiconductor specimen;
    estimate a contour for each structural element of interest (SEI) of a group of SEIs from the plurality of structural elements, and extract a set of attributes characterizing the contour, giving rise to a group of contours corresponding to the group of SEIs and respective sets of attributes associated therewith;
    for each given contour of the group of contours, identify, among remaining contours in the group of contours, one or more reference contours similar to the given contour, by comparing between the respective sets of attributes associated therewith; and
    measure a deviation between the given contour and each of the one or more reference contours thereof, giving rise to one or more measured deviations indicative of whether a defect is present with respect to a SEI associated with the given contour, wherein the defect indicates an edge displacement.

2. The computerized system according to claim 1, wherein the mask comprises a mask field of a single die and a scribe region, and the at least part of the mask includes at least part of the single die and/or at least part of the scribe region.

3. The computerized system according to claim 1, wherein the mask comprises a mask field of a plurality of dies and a scribe region, and the at least part of the mask includes at least part of the scribe region.

4. The computerized system according to claim 1, wherein the first image is acquired by an actinic inspection tool configured to emulate the optical configuration of the lithographic tool.

5. The computerized system according to claim 1, wherein the first image is obtained by acquiring an image using a non-actinic inspection tool, and performing simulation on the image to simulate the optical configuration of the lithographic tool, giving rise to the first image.

6. The computerized system according to claim 1, wherein the edge displacement is indicative of a relatively substantial deviation of the given contour from an expected position thereof with respect to a deviation threshold.

7. The computerized system according to claim 1, wherein the contour is estimated using an edge detection method.

8. The computerized system according to claim 1, wherein the set of attributes is selected from a group comprising: area formed by the contour, width of the area, height of the area, a number of pixels along the contour, chain code, and center of gravity.

9. The computerized system according to claim 1, wherein the PMC is configured to measure a deviation by:
    registering the given contour respectively with the one or more reference contours, giving rise to one or more registered pairs of contours;
    measuring distances between corresponding points of each registered pair of contours; and
    selecting a maximal distance from the measured distances as the measured deviation between the given contour and a respective reference contour of the one or more reference contours.

10. The computerized system according to claim 1, wherein the PMC is further configured to derive a combined deviation based on the one or more measured deviations, apply a deviation threshold to the combined deviation and report presence of a defect upon the combined deviation crossing the deviation threshold.

11. The computerized system according to claim 10, wherein the PMC is further configured to provide a defect map corresponding to the first image and indicative of presence of one or more defects on the at least part of mask and locations thereof.

12. The computerized system according to claim 1, wherein the PMC is configured to obtain a plurality of first images, each representative of a respective part of the mask, the plurality of first images being acquired consecutively with a predefined step size, such that a plurality of fields of view (FOVs) of the plurality of first images are not overlapped, and wherein the PMC is configured to perform said applying, estimating, identifying and measuring for each of the plurality of first images, and provide a defect map corresponding to each of the plurality of first images and indicative of presence of one or more defects on the respective part of the mask, thereby giving rise to a plurality of defect maps corresponding to the plurality of first images.

13. The computerized system according to claim 12, wherein the PMC is further configured to identify one or more SEIs associated with a defect presented in each of the plurality of defect maps, compare one or more contours of the one or more SEIs between the plurality of first images, and determine whether at least one defect is a false alarm indicative of presence of a unique structural element in at least one of the first images.

14. The computerized system according to claim 1, wherein the PMC is configured to obtain, for a given part of the mask, a plurality of first images each representative of at least the given part of the mask, the plurality of first images being acquired in a consecutive manner with a predefined step size, such that a plurality of fields of view (FOVs) of the plurality of first images are overlapped by at least the given part of the mask, and wherein the PMC is configured to perform said applying, estimating, identifying and measuring for each of the plurality of first images, provide a defect map corresponding to each of the plurality of first images and indicative of presence of one or more defects on at least the given part of the mask, thereby giving rise to a plurality of defect maps corresponding to the plurality of first images, and compare defects presented in the plurality of defect maps to determine whether a defect is a defect of interest or a false alarm.

15. A computerized method of inspecting a mask usable for fabricating a semiconductor specimen, the method performed by a processing and memory circuitry (PMC) and comprising:

obtaining a first image representative of at least part of the mask, wherein the first image is acquired by emulating optical configuration of a lithographic tool usable for fabrication of the semiconductor specimen;

applying a printing threshold on the first image, giving rise to a second image, wherein the second image is informative of a plurality of structural elements of the mask which are printable on the semiconductor specimen;

estimating a contour for each structural element of interest (SEI) of a group of SEIs from the plurality of structural elements, and extracting a set of attributes characterizing the contour, giving rise to a group of contours corresponding to the group of SEIs and respective sets of attributes associated therewith;

for each given contour of the group of contours, identifying, among remaining contours in the group of contours, one or more reference contours similar to the given contour, by comparing between the respective sets of attributes associated therewith; and measuring a deviation between the given contour and each of the one or more reference contours thereof, giving rise to one or more measured deviations indicative of whether a defect is present with respect to a SEI associated with the given contour, wherein the defect indicates an edge displacement.

16. The computerized method according to claim 15, wherein the mask comprises a mask field of a single die and a scribe region, and the at least part of the mask includes at least part of the single die and/or at least part of the scribe region.

17. The computerized method according to claim 15, wherein the measuring comprises:

registering the given contour respectively with the one or more reference contours, giving rise to one or more registered pairs of contours;

measuring distances between corresponding points of each registered pair of contours; and selecting a maximal distance from the measured distances as the measured deviation between the given contour and a respective reference contour of the one or more reference contours.

18. The computerized method according to claim 15, further comprising deriving a combined deviation based on the one or more measured deviations, applying a deviation threshold to the combined deviation, and reporting presence of a defect upon the combined deviation crossing the deviation threshold.

19. The computerized method according to claim 15, wherein the obtaining comprises obtaining, for a given part of the mask, a plurality of first images each representative of at least the given part of the mask, the plurality of first images being acquired in a consecutive manner with a predefined step size, such that a plurality of fields of view (FOVs) of the plurality of first images are overlapped by at least the given part of the mask, and wherein the method comprises performing said applying, estimating, identifying and measuring for each of the plurality of first images, providing a defect map corresponding to each of the plurality of first images and indicative of presence of one or more defects on at least the given part of the mask, thereby giving rise to a plurality of defect maps corresponding to the plurality of first images, and comparing defects presented in the plurality of defect maps to determine whether a defect is a defect of interest or a false alarm.

20. A non-transitory computer readable storage medium tangibly embodying a program of instructions that, when executed by a computer, cause the computer to perform a method of inspecting a mask usable for fabricating a semiconductor specimen, the method comprising:

obtaining a first image representative of at least part of the mask, wherein the first image is acquired by emulating optical configuration of a lithographic tool usable for fabrication of the semiconductor specimen;

applying a printing threshold on the first image, giving rise to a second image, wherein the second image is informative of a plurality of structural elements of the mask which are printable on the semiconductor specimen;

estimating a contour for each structural element of interest (SEI) of a group of SEIs from the plurality of structural elements, and extracting a set of attributes characterizing the contour, giving rise to a group of contours corresponding to the group of SEIs and respective sets of attributes associated therewith;

for each given contour of the group of contours, identifying, among remaining contours in the group of contours, one or more reference contours similar to the given contour, by comparing between the respective sets of attributes associated therewith; and measuring a deviation between the given contour and each of the one or more reference contours thereof, giving rise to one or more measured deviations indicative of whether a defect is present with respect to a SEI associated with the given contour, wherein the defect indicates an edge displacement.

\* \* \* \* \*